United States Patent
Yamazaki et al.

(10) Patent No.: US 8,040,024 B2
(45) Date of Patent: Oct. 18, 2011

(54) PIEZOCERAMIC MATERIAL, PIEZOELECTRIC ELEMENT AND NON-RESONANCE KNOCK SENSOR

(75) Inventors: Masato Yamazaki, Komaki (JP); Hideaki Hiramitsu, Gifu (JP); Manabu Horiguchi, Ise (JP); Yukihiro Hamaguchi, Ise (JP); Katsuya Yamagiwa, Komaki (JP); Takeshi Mitsuoka, Konan (JP); Kazushige Ohbayashi, Nagoya (JP); Ryotaro Tawara, Ise (JP); Tomohiro Hirata, Konan (JP)

(73) Assignee: NGK Spark Plug Co., Ltd., Aichi (JP)

( * ) Notice: Subject to any disclaimer, the term of this patent is extended or adjusted under 35 U.S.C. 154(b) by 407 days.

(21) Appl. No.: 12/397,956

(22) Filed: Mar. 4, 2009

(65) Prior Publication Data

US 2009/0223282 A1  Sep. 10, 2009

(30) Foreign Application Priority Data

Mar. 5, 2008 (JP) ................... 2008-054433
Jul. 16, 2008 (JP) ................... 2008-185029
Dec. 15, 2008 (JP) ................... 2008-317858

(51) Int. Cl.
*H01L 41/187* (2006.01)

(52) U.S. Cl. .................. 310/358; 73/35.11; 252/62.9 R; 252/62.9 PZ

(58) Field of Classification Search .................. 310/358; 252/62.9 R, 62.9 PZ; 73/35.11
See application file for complete search history.

(56) References Cited

U.S. PATENT DOCUMENTS

| 4,966,031 A * | 10/1990 | Mochizuki ................... 73/35.11 |
| 6,319,421 B1 * | 11/2001 | Yun et al. ................. 252/62.9 R |
| 7,915,794 B2 * | 3/2011 | Koike et al. ..................... 310/370 |
| 2007/0120446 A1 * | 5/2007 | Yamazaki et al. ............ 310/358 |
| 2007/0176516 A1 * | 8/2007 | Nagaya et al. ................ 310/346 |
| 2011/0037812 A1 * | 2/2011 | Naono et al. ..................... 347/68 |

FOREIGN PATENT DOCUMENTS

| JP | 04251991 A | * | 9/1992 |
| JP | 04298085 A | * | 10/1992 |
| JP | 06016473 A | * | 1/1994 |
| JP | 06219816 A | * | 8/1994 |
| JP | 06256061 A | * | 9/1994 |
| JP | 08143359 A | * | 6/1996 |
| JP | 09124366 A | * | 5/1997 |
| JP | 2789374 B2 | | 6/1998 |
| JP | 2957002 B2 | | 7/1999 |
| JP | 2964265 B2 | | 8/1999 |
| JP | 2001-4476 A | | 1/2001 |

OTHER PUBLICATIONS

"Electrical Test Methods for Piezoelectric Ceramic Vibrators", Standard of Electronic Materials Manufacturers Association of Japan, EMAS-6100.

* cited by examiner

*Primary Examiner* — Jaydi San Martin
(74) *Attorney, Agent, or Firm* — Sughrue Mion, PLLC

(57) ABSTRACT

A piezoceramic material according to an embodiment of the present invention has a composition represented by $Pb_m\{Zr_{1-x-y-z}Ti_xSn_y(Sb_{1-n}Nb_n)_z\}O_3$ where $1.000 \leq m \leq 1.075$, $0.470 \leq x < 0.490$, $0.020 \leq y \leq 0.040$, $0 < n < 1.000$ and $0 < z \leq 0.025$ and a crystallite size of 30 to 39 nm.

9 Claims, 4 Drawing Sheets

1μm

PIEZOCERAMIC MATERIAL, PIEZOELECTRIC ELEMENT AND NON-RESONANCE KNOCK SENSOR

BACKGROUND OF THE INVENTION

The present invention relates to a piezoceramic material suitable for use in piezoelectric sensors such as pressure sensor, acceleration sensor, knock sensor, yaw rate sensor, gyro sensor and shock sensor and other piezoelectric devices, a piezoelectric element using the piezoceramic material and a non-resonance knock sensor using the piezoelectric element.

Various piezoelectric sensors have widely been used in the areas of electronics and mechatronics. Each of the piezoelectric sensors includes a piezoelectric element equipped with a sintered piezoceramic body (bulk) and at least one pair of element electrodes so as to convert a mechanical stress applied thereto to an electricity or voltage by the piezoelectric effect of the piezoceramic body and generate an electrical signal based on the converted electricity or voltage. The sensitivity (output voltage) of the piezoelectric sensor varies as the piezoelectric characteristics of the piezoceramic body change with the ambient temperature of the operating environment. When the temperature of the piezoelectric sensor changes during operation or changes with the ambient temperature of the operating environment, there occurs a thermal stress in the piezoelectric element due to the difference in thermal expansion between the piezoceramic body and the element electrodes or other adjacent sensor parts. There also occurs a voltage in the piezoelectric sensor by the pyroelectric effect of the piezoceramic body in response to the temperature change. These introduce noise into the output of the piezoelectric sensor and thus lead to variations in the sensitivity of the piezoelectric sensor. Further, the piezoelectric characteristics of the piezoceramic body may deteriorate to cause a decrease in sensor output under the weight applied to the piezoelectric element. For the above reasons, the operating temperature of the piezoelectric sensor is generally set to about −40° C. to 170° C. It is however desired that the piezoelectric element exhibit no variations in temperature characteristics over a wider temperature range in view of the fact that the piezoelectric sensors are used under severe conditions in e.g. automotive engines.

In order to achieve such a temperature-stable piezoelectric element, Japanese Patent No. 2789374, Japanese Patent No. 2964265 and Japanese Patent No. 2957002 disclose PZT (lead zirconate titanate) piezoceramic materials doped with Sn, Nb and Sb so as to obtain improvements in thermal stability by the addition of Sn and to enable low-temperature sintering and softening (i.e. improvements in piezoelectric characteristics with large crystal distortion) by the addition of Nb and Sb.

SUMMARY OF THE INVENTION

The above conventional piezoceramic materials need further improvements in piezoelectric and temperature characteristics. For example, there is a demand for piezoceramic materials having a piezoelectric constant d33 of 340 pC/N or larger (as an index of piezoelectric sensitivity) and piezoceramic materials having a Curie point of 340° C. or higher (as an index of heat resistance) so that the piezoceramic materials can suitably be applied to the piezoelectric sensors in the automotive engines, which could reach a maximum temperature of about 170° C. However, no reports have been made on any piezoceramic materials having a piezoelectric constant d33 of 340 pC/N or larger and/or a Curie temperature of 340° C. or higher.

It is therefore an object of the present invention to provide a piezoceramic material with good piezoelectric and temperature characteristics. It is also an object of the present invention to provide a piezoelectric element using the piezoceramic material and a non-resonance knock sensor using the piezoelectric element.

As a result of extensive researches, it has been founded that it is possible to provide a Pb/Zr/Ti/Sn/Sb/Nb oxide material with high heat resistance and good piezoelectric characteristics by controlling the composition and crystalline state of the material to within specific ranges. The present invention is based on this finding.

According to a first aspect of the present invention, there is provided a piezoceramic material having a composition represented by $Pb_m\{Zr_{1-x-y-z}Ti_xSn_y(Sb_{1-n}Nb_n)_z\}O_3$ where $1.000 \leq m \leq 1.075$, $0.470 \leq x < 0.490$, $0.020 \leq y \leq 0.040$, $0 < n < 1.000$ and $0 < z \leq 0.025$ and a crystallite size of 30 to 39 nm.

According to a second aspect of the present invention, there is provided a piezoceramic material having a composition represented by $Pb_m\{Zr_{1-x-y-z}Ti_xSn_y(Sb_{1-n}Nb_n)_z\}O_3$ where $1.000 \leq m \leq 1.075$, $0.470 \leq x < 0.490$, $0.020 \leq y \leq 0.040$, $0 < n < 1.000$ and $0 < z \leq 0.025$ and a piezoelectric constant d33 of 340 pC/N or larger.

According to a third aspect of the present invention, there is provided a piezoelectric element comprising an element body formed of the above piezoceramic material.

According to a fourth aspect of the present invention, there is provided a non-resonance knock sensor, comprising: a piezoelectric element having an element body formed of the above piezoceramic material and at least one pair of electrodes arranged on the element body; a support member having a support portion to support the piezoelectric element; a weighting member disposed on the piezoelectric element to press the piezoelectric element against the support portion; and a resin molded part covering the piezoelectric element and the weighting member from the outside of the support member.

According to a fifth aspect of the present invention, there is provided a non-resonance knock sensor, comprising: a piezoelectric element having an element body formed of the above piezoceramic material and a pair of first and second electrodes arranged on the element body; a support member having a support portion to support the piezoelectric element; and a weighting member disposed on the piezoelectric element to press the piezoelectric element against the support portion, wherein at least part of a surface of the first electrode faces a bottom surface of the weighting member when the piezoelectric element and the weighting member are projected in a thickness direction of the piezoelectric element; and the ratio of an area of said at least part of the surface of the first electrode to an area of the bottom surface of the weighting member is 45% or higher.

The other objects and features of the present invention will also become understood from the following description.

DESCRIPTION OF THE EMBODIMENTS

Figure 1:
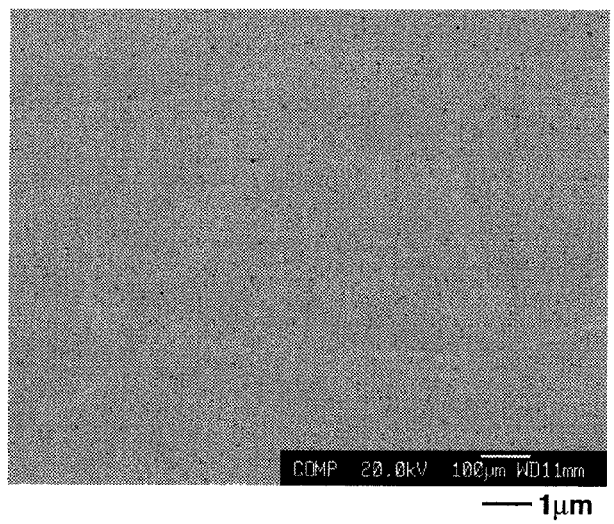
FIG. 1 is a scanning electron microscopic picture of a piezoceramic material according to the earlier technology.

The present invention will be described in detail below with reference to the drawings.

A piezoceramic material according to one exemplary embodiment of the present invention (hereinafter just referred to as "piezoceramic material") is PZT ($PbTiO_3$—$PbZrO_3$) ceramic doped with Sn, Sb and Nb.

When Zr substitutes for Ti in a tetragonal ferroelectric material $PbTiO_3$ until the amount of Zr in the resulting PZT solid solution reaches about 53 mol %, the crystal structure of the material changes to a rhombohedral structure. This boundary at which the crystal structure of the material changes with composition is called a morphotoropic phase boundary (MPB). It is known that: the piezoelectricity of the PZT material becomes maximized at around the morphotoropic phase boundary, whereas the stability of the PZT material becomes deteriorated to cause a large change of capacitance Cp versus temperature at around the morphotoropic phase boundary.

Accordingly, the piezoceramic material has a composition represented by $Pb_m\{Zr_{1-x-y-z}Ti_xSn_y(Sb_{1-n}Nb_n)_z\}O_3$ where $1.000 \leq m \leq 1.075$, $0.470 \leq x < 0.490$, $0.020 \leq y \leq 0.040$, $0 < n < 1.000$ and $0 < z \leq 0.025$, so as to differ in composition from the morphotoropic phase boundary, benefit from the substitution (doping) effect of Sn, Sb and Nb and thereby secure compatibility between the piezoelectric characteristics and temperature stability of capacitance Cp in the present embodiment.

With the above specific composition, the piezoceramic material attains a piezoelectric constant d33 of 340 pC/N or larger. The piezoelectric constant d33 is defined as the amount of electric charges generated by the positive piezoelectric effect of the piezoceramic material under the application of a mechanical force, stress, pressure etc. thereto. It is said that, the larger the piezoelectric constant d33, the larger the amount of electric charges generated by the piezoceramic material and, in the case of using the piezoceramic material in a piezoelectric sensor, the higher the output (sensitivity) of the piezoelectric sensor.

If m<1, the piezoceramic material decreases in piezoelectric constant d33 due to the difference from the PZT composition. If m>1.075, the piezoceramic material decreases in piezoelectric constant d33 due to the formation of PbO. If x<0.470, the amount of Ti in the piezoceramic material is so small that the piezoceramic material may have a large capacitance change rate of ΔCp>2500 ppm/K. If $0.490 \leq x$, the piezoceramic material tends to be low in piezoelectric constant d33 and shows a large deterioration of the piezoelectric constant d33 by heat. If y<0.020, the Curie temperature Tc of the piezoceramic material may decrease due to the small amount of Sn. If n=0, the piezoceramic material deteriorates in crystal stability due to the absence of Nb. If n=1.000, the piezoceramic material also deteriorates in crystal stability due to the absence of Sb. If z=0, the piezoceramic material increases in sintering temperature due to the absence of both Nb and Sb so that the crystallite size of the piezoceramic material cannot be controlled to within the after-mentioned specific range. In addition, the piezoceramic material shows a large deterioration of the piezoelectric constant d33 by heat. If $0.025 \leq z$, the piezoceramic material may have a large capacitance change rate of ΔCp>2500 ppm/K or may decrease in Curie temperature Tc due to the presence of excessive Nb and Sb.

Further, the piezoceramic material has a crystallite size of 30 to 39 nm. The crystallite is defined as a domain (microcrystal) that can be regarded as a single crystal, and the crystallite size is used as a parameter of crystallinity (crystalline perfection) and defined as the size of that domain. Most materials are made of a plurality of crystallites. If the crystallite size is less than 30 nm, the domains in which all parts have the same crystallographic orientation are small. This makes it difficult to improve the piezoelectric characteristics of the piezoceramic material. Theoretically, the piezoelectric characteristics of the piezoceramic material can be improved by raising the sintering (firing) temperature of the piezoceramic material and thereby increasing the crystallite size of the piezoceramic material. In actual, however, the composition of the piezoceramic material breaks down by evaporation of the volatile elements Pb, Sn and Sb so that the piezoelectric characteristics of the piezoceramic material would be deteriorated rather than improved when the sintering temperature of the piezoceramic material becomes too high. It is conceivable to control the crystallite size by adjusting not only the sintering temperature but the calcination conditions and raw powder pulverized size of the piezoceramic material as appropriate.

On the other hand, it is difficult to improve the piezoelectric characteristics of the piezoceramic material by controlling the crystal grain size of the piezoceramic material as the crystal grain size does not always reflect the above-explained crystallite domain size of the piezoceramic material. If the crystal grain size is too large, however, there is a tendency that the spaces between crystal grains of the piezoceramic material become increased to decrease the amount of electric charges generated by the application of a mechanical load to the piezoceramic material. The crystallite size, rather than the crystal grain size, is thus used as a control parameter for improving the piezoelectric characteristics of the piezoceramic material in the present embodiment.

The crystallite size of the piezoceramic material can be measured by XRD (X-ray diffraction) and, more specifically, by taking a X-ray diffraction pattern of the piezoceramic material, determining the half width (or integral width) of a peak in the X-ray diffraction pattern, which indicates the degree of scattering of incident X-ray beam, and then, substituting the peak half width (integral width) into the following Scherrer equation: $D = K\lambda/(\beta \cos \theta)$ where D is the crystallite size; K is the Scherrer constant; λ is the X-ray wavelength; β is the half width at half maximum of reflected X-ray beam; and θ is the diffraction angle.

Preferably, the piezoceramic material has a Curie temperature Tc of 340° C. or higher. The heat resistance of the piezoceramic material increases with Curie temperature Tc so that the piezoceramic material becomes more suitable for high-temperature uses such as automotive engine.

The piezeceramic material also preferably has a capacitance change rate ΔCp of 2500 ppm/K or lower in a temperature range of 20° C. to 150° C. The amount of change of the capacitance Cp with temperature becomes small as the capacitance change rate ΔCp decrease. In the case of using the piezoceramic material in a piezoelectric sensor, such a low capacitance change rate ΔCp leads to a reduction in the sensitivity variations of the piezoelectric sensor.

It is further preferable that the rate of deterioration of the piezoelectric constant d33 (hereinafter just referred to as "piezoelectric constant deterioration rate Δd33") of the piezoceramic material during heat-resistance test for 10 hours at 250° C. in the air falls within −10%. The piezoelectric constant deterioration rate Δd33 is given by the expression {(piezoelectric constant d33 after heat-resistance test)−(initial piezoelectric constant d33)}/(initial piezoelectric constant d33). The heat resistance of the piezoceramic material increases as the piezoelectric constant deterioration rate Δd33 decreases in absolute value.

The piezeceramic material can be favorably applied to a piezoelectric element by arranging at least at least one pair of positive and negative element electrodes on the piezoceramic material. Since the piezoceramic material has good stability, heat resistance and durability as described above, the thus-obtained piezoelectric element is suitable for use in a piezoelectric sensor such as combustion pressure sensor, knock sensor, gyro sensor etc., a piezoelectric resonator, a piezoelectric vibrator, a piezoelectric actuator, an ultrasonic motor, a fingerprint identification device or a pressure-sensitive device.

The piezoceramic material and the piezoelectric element can be produced by the following procedures.

First, oxide, carbonate or bicarbonate raw powders are weighed out and blended together to attain the above-specific piezoceramic material composition. The powder blend is added to a dispersion medium such as ethanol or water, wet-blended and pulverized by a ball mill etc. The resulting slurry is dried to yield a mixed raw powder material.

The raw powder material is calcinated e.g. in the air at 600 to 1100° C. for 10 to 300 minutes. The calcinated powder material is mixed with an organic binder such as polyvinyl alcohol or polyvinyl butyral, a water-soluble binder and a dispersion medium such as alcohol, ether or water and wet-pulverized by a ball mill etc. The resulting slurry is dried to yield a pulverized powder material.

The pulverized powder material is compacted into a desired shape. There is no particular restriction on the shape of the compact. The compact can be of any appropriate shape such as ring shape or disc shape. For example, it is desirable to compact the powder material by uniaxial molding at about 30 MPa and then cold isostatic pressing (CIP) at about 150 MPa. The compact is sintered e.g. at 900 to 1250° C. for 1 to 10 hours.

At least one pair of element electrodes are formed on opposite sides of the sintered compact by, e.g., in the case where the sintered compact is of disc shape, surface grinding the opposite disc surfaces of the sintered compact, applying a conductive paste to the ground opposite surfaces of the sintered compact by screen printing and baking the conductive paste as appropriate. The conductive paste is generally prepared from a conductive component, a glass frit and an organic medium. Examples of the conductive component are powders of noble metals such as silver, gold, palladium and platinum and alloys thereof and any mixture thereof. As the conductive component, there can also be used powders of other metals such as copper and nickel and alloys thereof and any mixture thereof. Examples of the glass frit are those containing $SiO_2$, $Al_2O_3$, ZnO and $TiO_2$. Examples of the organic medium are those commonly used for this kind of conductive paste, such as alcohol and ether.

Finally, the sintered compact is polarized through the application of a direct-current voltage of about 3 to 20 kV/mm between the electrodes for about 10 to 100 minutes in an insulating oil such as silicone oil in a temperature range of room temperature to about 200° C. The polarization may alternatively be conducted by applying a high voltage to the sintered compact while overheating the sintered compact in the air. The electrodes may optionally be removed. The thus-obtained sintered compact with or without the element electrodes can be used as the piezoceramic material.

Figure 5:
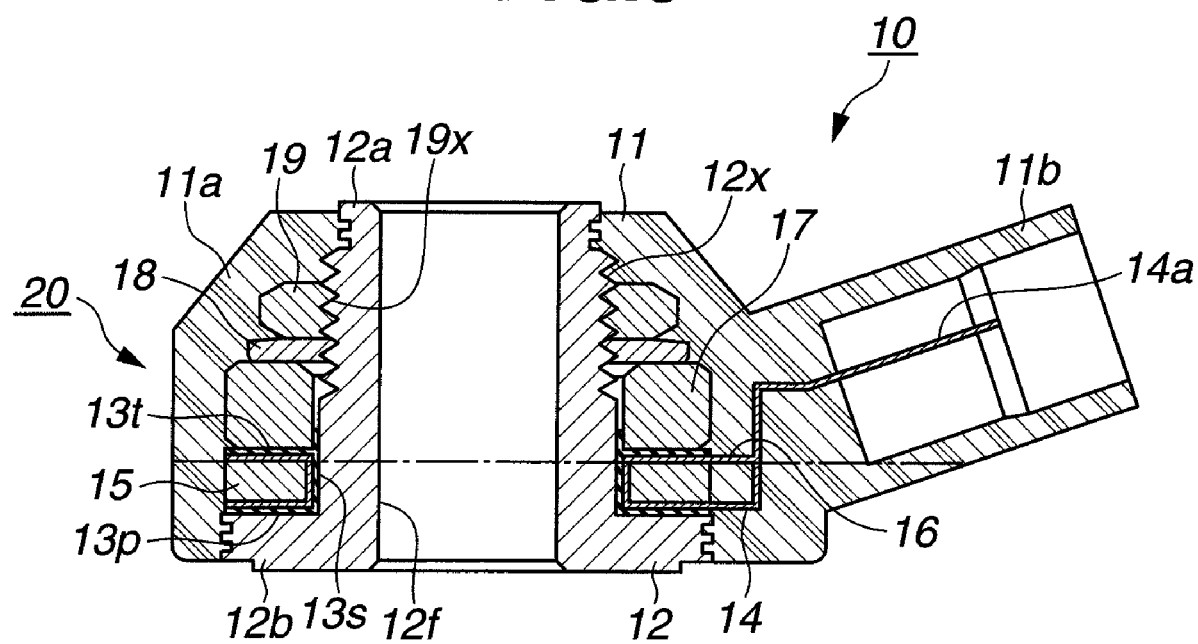
FIG. 5 is a section view of a non-resonance knock sensor according to one embodiment of the present invention.

One use of the piezoelectric element is as a piezoelectric element 15 of a non-resonance knock sensor 10 as shown in FIG. 5. In the present embodiment, the knock sensor 10 is designed as a so-called "center-hole type" non-resonance knock sensor for an internal combustion engine that is short cylindrical in shape as a whole with a sensor mount hole 12*f* formed in the center thereof for mounting on a cylinder block of the engine.

Figure 6:
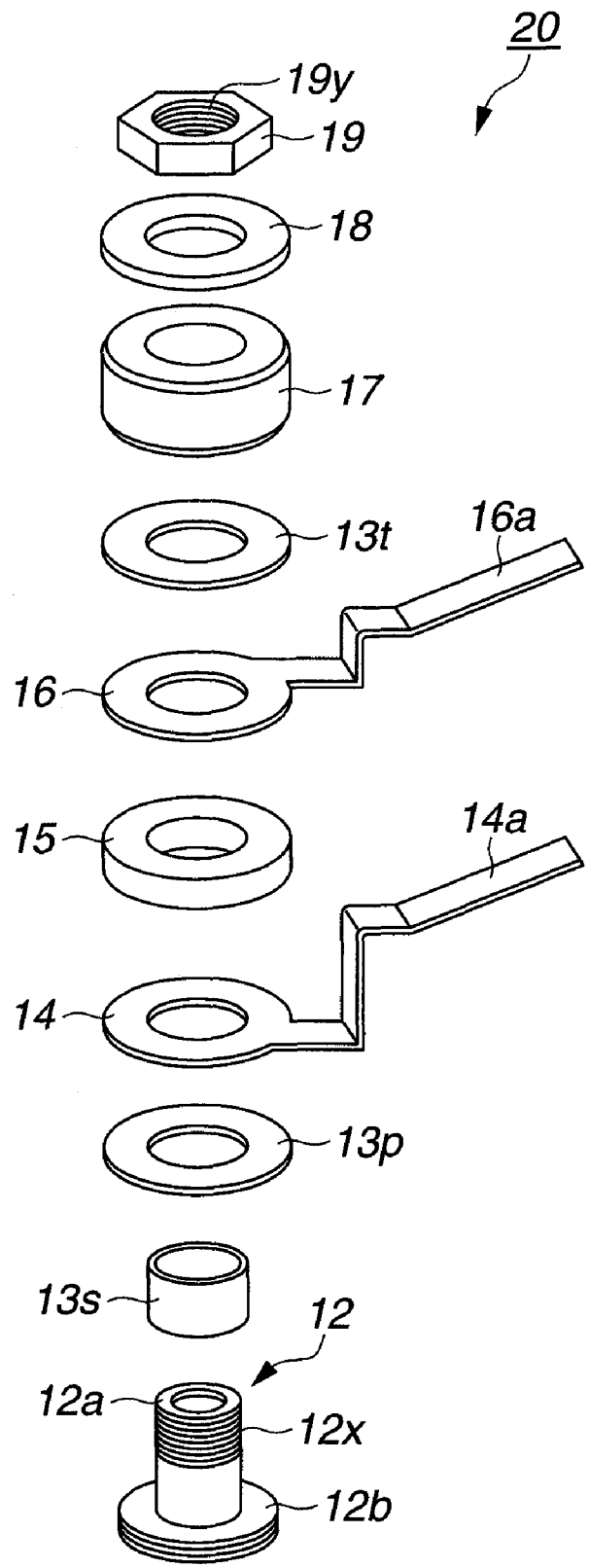
FIG. 6 is an exploded perspective view of the non-resonance knock sensor of FIG. 5.

More specifically, the knock sensor 10 includes a resin molded part 11 and a sensor unit 20 in which the piezoelectric element 15 is built together with a support member (metal shell) 12 and a weighting member 17 as shown in FIGS. 5 and 6.

Figure 7:
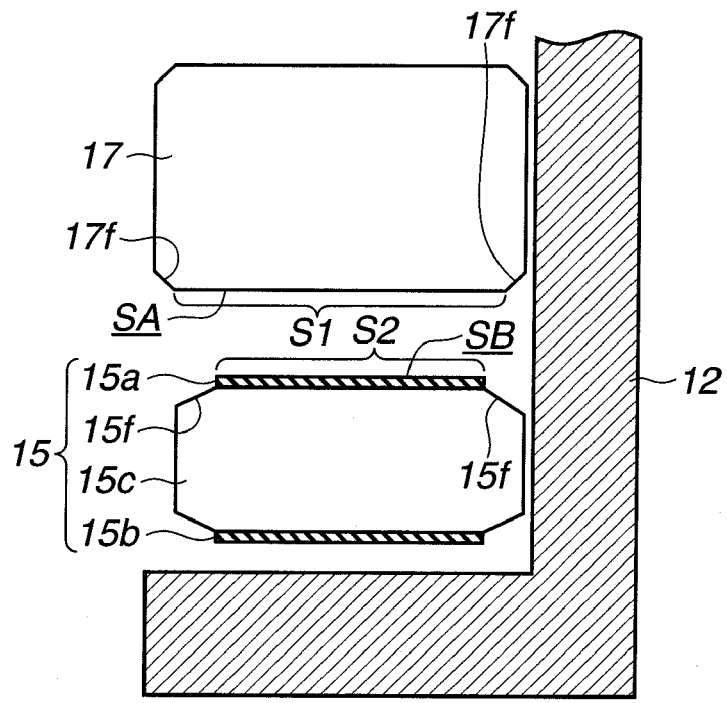
FIG. 7 is a sectional view of a piezoelectric element and a weighting member of the non-resonance knock sensor of FIGS. 5 and 6.

As shown in FIG. 7, the piezoelectric element 15 has an annular element body 15*c* formed of the piezoceramic material and a pair of element electrodes 15*a* and 15*b* formed on upper and lower sides of the element body 15*c*. The support member 12 has a cylindrical portion 12*a* formed with an external thread 12*x* and a flanged support portion 12*b* formed on a lower end of the cylindrical portion 12*a* to support thereon the piezoelectric element 15. The weighting member 17 has an annular shape and is fitted around the cylindrical portion 12*a* and disposed on the piezoelectric element 15 to press the piezoelectric element 15 against the support portion 12*b*.

The resin molded part 11 has a casing portion 11*a* disposed around the sensor unit 20 to cover the piezoelectric element 15 and the weighting member 17 etc. from the outside of the support member 12 and a connector portion 11*b* radially outwardly protruding from an outer circumferential surface of the casing portion 11*a*.

The sensor unit 20 further includes insulating members such as a cylindrical insulating sleeve 13*s* and annular insulating plates 13*p* and 13*t*, upper and lower annular lead electrodes 16 and 14 and holding members such as a disc spring 18 and a nut 19 as shown in FIGS. 5 and 6.

The lead electrodes 16 and 14 are arranged on and connected to the element electrodes 15*a* and 15*b*, respectively. Flake-shaped terminal portions 16*a* and 14*a* are formed on the lead electrodes 16 and 14 and passed through the connector portion 11*b* for connection to an external connector. (In FIG. 5, only the terminal portion 14*a* is illustrated for simplicity.)

The insulating plate 13*p* is interposed between the support portion 12*b* and the lower lead electrode 14, whereas the insulating plate 13*t* is interposed between the upper lead electrode 16 and the weighting member 17. The insulating sleeve 13*s* is fitted around the cylindrical portion 12*a*. By these insulating members 13*p*, 13*t* and 13*s*, the piezoelectric element 15 and the lead electrodes 16 and 14 are kept electrically insulated from the support member 12 and the weighting member 17.

The disc spring 18 is fitted around the cylindrical portion 12a and placed on the weighting member 17. The nut 19 is formed with an internal thread 19y and screwed onto the external thread 12x so as to hold the insulating plate 13p, the lower lead electrode 14, the piezoelectric element 15, the upper lead electrode 16, the insulating plate 13t, the weighting member 17 and the disc spring 18 (in order of mention) between the support portion 12b and the nut 19 and thereby allows the weighting member 17. As these holding members 18 and 19 let the weighting member 17 press the piezoelectric element 15 against the support portion 12b, the piezoelectric element 15 is placed under mechanical load (preset load) in an assembled state of the knock sensor 10. Alternatively, the piezoelectric element 15 may be held in position under mechanical load by an adhesive member or mold.

When a mechanical force, stress, pressure etc. is applied to the piezoelectric element 15 in this sensor state, the piezoelectric element 15 generates an electricity or voltage by its positive piezoelectric effect. The generated electricity or voltage is taken out of the piezoelectric element 15 through the lead electrodes 14 and 16.

Although not so shown in the drawings, the knock sensor 10 further includes an electric circuit to take the electricity or voltage from the piezoelectric element 15 and convert the electricity or voltage into an electrical signal (voltage signal). The electric circuit may be integrated into or arranged separately on the knock sensor 10.

As shown in FIG. 7, at least part of an upper surface (top surface) SB of the element electrode 15a faces a lower surface (bottom surface) SA of the weighting member 17 when the piezoelectric element 15 and the weighting member 17 are projected in a thickness direction of the piezoelectric element 15. In the present embodiment, the whole of the element electrode 15a vertically faces the weighting member 17 through the insulating plate 13t. In view of the cost performance and sensitivity of the knock sensor 10, it is preferable that the ratio of the area S2 of the at least part of the upper surface SB of the element electrode 15a to the area S1 of the lower surface SA of the weighting member 17 is 45% or higher. When the upper surface area S2 of the element electrode 15a is smaller than the lower surface area S1 of the weighting member 17, it is possible to decrease the amount of electrode material used in the element electrode 15a and the amount of electrode material used in the counter electrode 15b and thereby reduce the cost of the knock sensor 10. It is also possible to secure a higher degree of flexibility in changing the surface area ratio S2/S1 and adjust the capacitance Cp of the piezoelectric element 15 as appropriate. If the upper surface area S2 of the element electrode 15a is too much smaller than the lower surface area S1 of the weighting member 17, however, the sensitivity of the knock sensor 10 becomes deteriorated due to lowered sensor output.

In the case where the inner and outer edges of the lower end of the weighting member 17 are chamfered to form chamfered regions 17f as shown in FIG. 7, these chamfered regions 17f are not included in the bottom surface SA of the weighting member 17. Any flat surface region, other than the chamfered regions 17f, of the weighting member 17 vertically facing the element electrode 15a is regarded as the bottom surface SA of the weighting member 17. Similarly, in the case where the inner and outer edges of the upper end of the element body 15c of the piezoelectric element 15 are chamfered to form chamfered regions 15f and the element electrode 15a is formed on the top surface of the element body 15c of the piezoelectric element 15 except for the chamfered regions 15f as shown in FIG. 7, these chamfered regions 15f are not included in the top surface SB of the element electrode 15a. Any surface region, other than the chamfered regions 15f, of the element electrode 15a vertically facing the weighting member 17 is regarded as the top surface SB of the element electrode 15a.

The present invention will be described in more detail by reference to the following examples. It should be however noted that the following examples are only illustrative and not intended to limit the invention thereto.

Experiment 1

Piezoceramic materials of Examples 1 to 9 and Comparative Example 1 to 6 were produced as follows. In each of Examples 1 to 9 and Comparative Examples 1 to 6, raw powders of zirconium oxide, titanium oxide, tin oxide, antimony oxide and niobium oxide were weighed out and blended together to form a composition of TABLE 1 when sintered. The resulting powder blend was added to ethanol, subjected to wet-blending/pulverization by a ball mill and dried to yield a mixed raw powder material. The raw powder material was calcinated in the air at 800° C. for 2 to 3 hours. The pulverized size of the calcinated powder material was about 0.6 to 1 μm. The calcinated powder material was mixed with an organic binder, a water-soluble binder and alcohol, subjected to wet-pulverization by a ball mill and dried to yield a pulverized powder material. The pulverized powder material was compacted into a disc shape with a diameter of 19 mm and a thickness of 1.4 mm by uniaxial molding at about 30 MPa and cold isostatic pressing (CIP) at about 150 MPa. The compact was sintered in the air at 1100° C. or 1300° C. for 2 to 4 hours. A pair of electrodes was formed on the sintered compact by grinding opposite surfaces of the sintered compact, applying a silver paste to the ground opposite surfaces of the sintered compact and baking the silver paste. The piezoceramic material was then completed by polarizing the sintered compact through the application of a direct-current voltage of 3 to 5 kV/mm between the electrodes in a silicone oil at 100 to 150° C.

Each of the piezoceramic materials was tested for capacitance change rate $\Delta Cp$, Curie temperature Tc, piezoelectric constant d33 and piezoelectric constant deterioration rate $\Delta d33$ under the following conditions. The evaluation test results are indicated in TABLE 1. Further, pictures of the piezoceramic materials were optionally taken by a scanning electron microscope. The electron microscopic picture of Comparative Example 5 is indicated in FIG. 1.

[1] Capacitance Change Rate $\Delta Cp$

The capacitance Cp(20) of the piezoceramic material at 20° C. and the capacitance Cp(150) of the piezoceramic material at 150° C. were measured a using an impedance analyzer ("HP4194 type" available from Hewlett-Packard Company). The capacitance change rate $\Delta Cp$ was determined by the following equation: $\Delta Cp = \{(Cp(150) - Cp(20))/Cp(20)\}/(150-20) \times 1000000$. It can be said that there would be no problem in practical use when $\Delta Cp \leq 2500$ ppm/K.

[2] Curie Temperature Tc

The Curie temperature Tc of the piezoceramic material was measured using an impedance analyzer ("HP4194A type" available from Hewlett-Packard Company) and an electric furnace.

[3] Piezoelectric Constant d33

The piezoelectric constant d33 of the piezoceramic material was measured by the resonance/anti-resonance method according to EMAS-6100 using a d33 meter (available from "Chinese Academy of Sciences") in combination.

[4] Piezoelectric Constant Deterioration Rate $\Delta d33$

The initial piezoelectric constant d33 of the piezoceramic material was measured in the same way as above. The piezoceramic material was then subjected to heat-resistance test for 10 hours at 250° C. in the air. After the heat-resistance test, the piezoelectric constant d33 of the piezoceramic material was measured in the same way as above. The piezoelectric constant deterioration rate Δd33 was determined by the following equation: Δd33={(piezoelectric constant d33 after heat-resistance test)−(initial piezoelectric constant d33)}/(initial piezoelectric constant d33).

TABLE 1

| | $Pb_m\{Zr_{1-x-y-z}Ti_xSn_y(Sb_{1-n}Nb_n)_z\}O_3$ | | | | |
|---|---|---|---|---|---|
| | m | x | y | n | z |
| Example 1 | 1.010 | 0.480 | 0.030 | 0.600 | 0.017 |
| Example 2 | 1.025 | 0.480 | 0.030 | 0.600 | 0.017 |
| Example 3 | 1.025 | 0.470 | 0.030 | 0.600 | 0.017 |
| Example 4 | 1.025 | 0.480 | 0.020 | 0.600 | 0.017 |
| Example 5 | 1.025 | 0.480 | 0.040 | 0.600 | 0.017 |
| Example 6 | 1.025 | 0.480 | 0.030 | 0.500 | 0.017 |
| Example 7 | 1.025 | 0.480 | 0.030 | 0.700 | 0.017 |
| Example 8 | 1.025 | 0.480 | 0.030 | 0.600 | 0.010 |
| Example 9 | 1.025 | 0.480 | 0.030 | 0.600 | 0.025 |
| Comparative Example 1 | 1.025 | 0.490 | 0.030 | 0.600 | 0.017 |
| Comparative Example 2 | 1.025 | 0.480 | 0.030 | 0.600 | 0.000 |
| Comparative Example 3 | 1.025 | 0.480 | 0.030 | 0.000 | 0.017 |
| Comparative Example 4 | 1.025 | 0.480 | 0.030 | 1.000 | 0.017 |
| Comparative Example 5 | 1.100 | 0.480 | 0.030 | 0.600 | 0.017 |
| Comparative Example 6 | 0.970 | 0.480 | 0.030 | 0.600 | 0.017 |

| | Evaluation results | | | | |
|---|---|---|---|---|---|
| | ΔCp (ppm/K) | d33 (pC/N) | Tc (° C.) | Δd33 (%) | Sintering temperature (° C.) | Total evaluation |
| Example 1 | 1800 | 384 | 366 | −8 | 1100 | ○ |
| Example 2 | 1866 | 400 | 367 | −7 | 1100 | ○ |
| Example 3 | 2481 | 454 | 360 | −3 | 1100 | ○ |
| Example 4 | 1889 | 403 | 359 | −7 | 1100 | ○ |
| Example 5 | 1907 | 399 | 364 | −7 | 1100 | ○ |
| Example 6 | 1859 | 400 | 357 | −8 | 1100 | ○ |
| Example 7 | 1822 | 390 | 360 | −9 | 1100 | ○ |
| Example 8 | 1850 | 409 | 368 | −6 | 1100 | ○ |
| Example 9 | 2417 | 373 | 356 | −3 | 1100 | ○ |
| Comparative Example 1 | 1800 | 339 | 367 | −22 | 1100 | X |
| Comparative Example 2 | 411 | 355 | 387 | −15 | 1300 | X |
| Comparative Example 3 | 2800 | 364 | 345 | −8 | 1100 | X |
| Comparative Example 4 | 2590 | 343 | 367 | −5 | 1100 | X |
| Comparative Example 5 | — | 280 | — | — | 1100 | X |
| Comparative Example 6 | — | 321 | — | — | 1100 | X |

As is seen from TABLE 1, the piezoceramic materials of Examples 1 to 9 (where $1.000 \leq m \leq 1.075$, $0.470 \leq x < 0.490$, $0.020 \leq y \leq 0.040$, $0 < n < 1.000$ and $0 < z \leq 0.025$) had a capacitance change rate ΔCp of 2500 ppm/K or lower, a Curie temperature Tc of 340° C. or higher, a piezoelectric constant d33 of 340 pC/N or larger and a piezoelectric constant deterioration rate Δd33 of −10% or better and thus showed good piezoelectric and temperature characteristics. By contrast, the piezoceramic material of Comparative Example 1 (where $0.490 \leq x$) had a piezoelectric constant d33 of lower than 340 pC/N and a piezoelectric constant deterioration rate Δd33 of over −10% and showed much inferior piezoelectric characteristics. The piezoceramic material of Comparative Example 2 (where z=0) had a piezoelectric constant deterioration rate Δd33 of over −10% and a high sintering temperature of 1300° C. As will be discussed in detail below, it is not so desirable to set the sintering temperature to 1300° C. or higher because the crystallites of the piezoceramic material grow suddenly to coarse grains and causes a decrease in piezoelectric constant d33. The piezoceramic materials of Comparative Example 3 (where n=0) and Comparative Example 4 (where n=1) had a capacitance change rate ΔCp of over 2500 ppm/K as the crystal stability of the piezeceramic materials deteriorated in the presence of either one of Nb and Sb. The piezoceramic material of Comparative Example 5 (where m>1.075) had a piezoelectric constant d33 of lower than 340 pC/N and showed much inferior piezoelectric characteristics as PbO appeared in streak form in the piezoceramic material as shown in white in FIG. 1. The piezoceramic material of Comparative Example 6 (where m<1) also had a piezoelectric constant d33 of lower than 340 pC/N and showed much inferior piezoelectric characteristics. It has been shown that the piezoceramic material attains good piezoelectric and temperature characteristics by controlling the composition of the piezoceramic material as represented by $Pb_m\{Zr_{1-x-y-z}Ti_xSn_y(Sb_{1-n}Nb_n)_z\}O_3$ where $1.000 \leq m \leq 1.075$, $0.470 \leq x < 0.490$, $0.020 \leq y \leq 0.040$, $0 < n < 1.000$ and $0 < z \leq 0.025$.

Experiment 2

Figure 3:
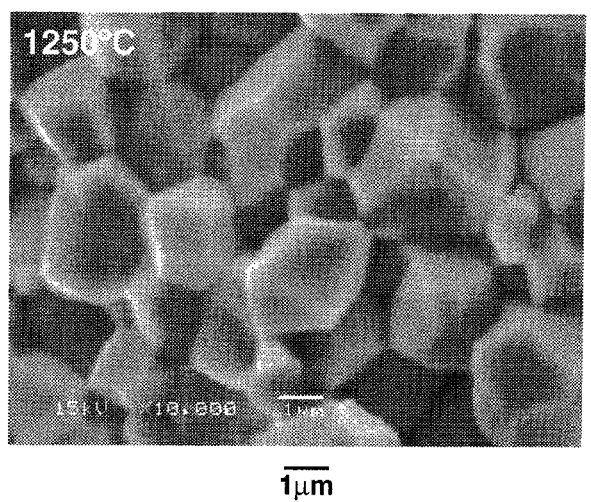
FIG. 3 is a scanning electron microscopic picture of a piezoceramic material, sintered at 1250° C., according to the present invention.
Figure 4:
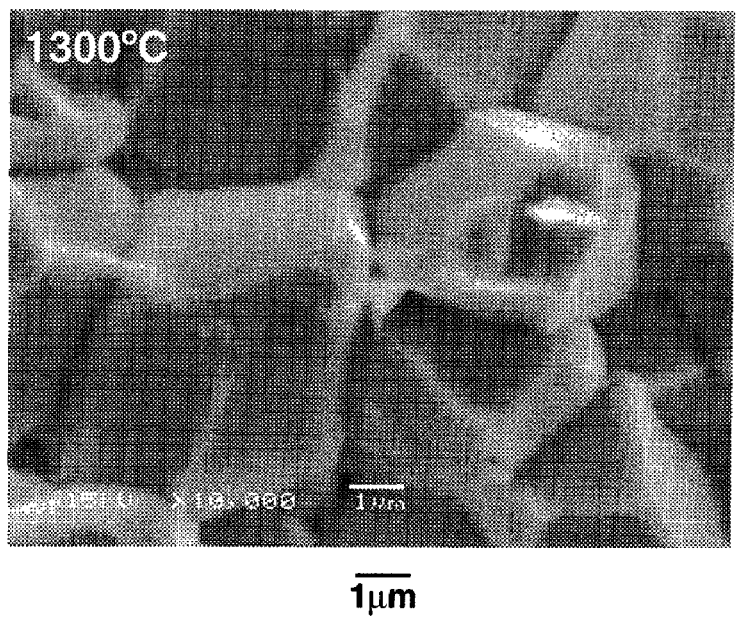
FIG. 4 is a scanning electron microscopic picture of a piezoceramic material, sintered at 1300° C., according to the present invention.

Piezoceramic materials were produced in the same way as in Example 1 of Experiment 1 except for varying the sintering temperatures of the piezoceramic materials. Each of the piezoceramic materials was tested for piezoelectric constant d33 in the same way as in Experiment 1. After removing the electrodes from the surfaces of the piezoceramic material, the surface of the piezoceramic material was observed by XRD to determine the crystallite size of the piezoceramic material according to the Scherrer equation. The evaluation test results are indicated in TABLE 2 and FIG. 2. Further, pictures of the piezoceramic materials sintered at 1250° C. and 1300° C. were taken by a scanning electron microscope. The electron microscopic pictures are indicated in FIGS. 3 and 4, respectively.

TABLE 2

| | Sintering temperature (° C.) | | | | | | |
|---|---|---|---|---|---|---|---|
| | 1000 | 1050 | 1100 | 1150 | 1200 | 1250 | 1300 |
| d33 (pC/N) | 320 | 365 | 384 | 381 | 358 | 347 | 312 |
| Grain size (μm) | 0.6 | 0.8 | 1.2 | 1.6 | 2.0 | 3.0 | 3.5 |
| Crystallite size (nm) | 26.2 | 30.0 | 32.1 | 34.3 | 38.4 | 39.0 | 41.4 |

Figure 2:
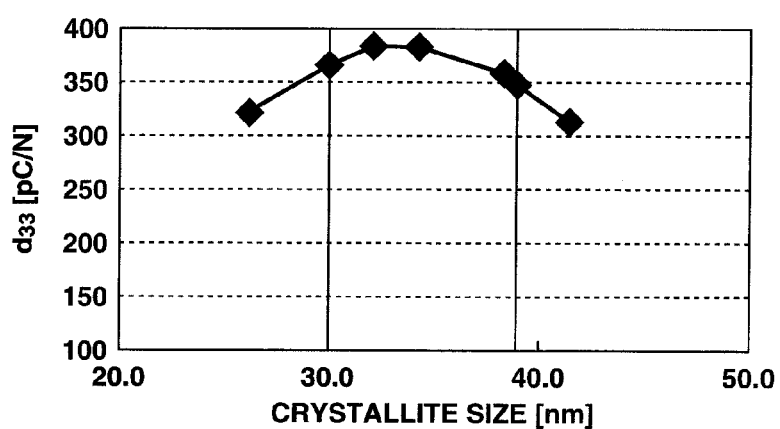
FIG. 2 is a graph showing the relationship of crystallite size and piezoelectric constant d33 of a piezoceramic material according to the present invention.

As is seen from TABLE 2 and FIG. 2, the piezoceramic material had a piezoelectric constant d33 of 340 pC/N or larger and a crystallite size of 30 to 39 nm when the sintering temperature was in the range of 1050 to 1250° C. When the sintering temperature was lower than 1050° C. or higher than 1250° C., the piezoceramic material had a piezoelectric constant d33 of lower than 340 pC/N and a crystallite size of less than 30 nm or over 39 nm. As is seen from FIGS. 3 and 4, the crystallites of the piezoceramic material suddenly grew to coarse grains when the sintering temperature reached 1300° C. It has been thus shown that it is desirable to control the crystallite size of the piezoceramic material to within 30 to 39 nm by adjusting the sintering temperature etc. in order to improve the piezoelectric characteristics of the piezoceramic material.

Experiment 3

Samples of the non-resonance knock sensor 10 (hereinafter just referred to as "sample sensors") were produced as shown in FIGS. 5 to 7 by using the same piezoceramic materials as that of Example 1 of Experiment 1 as the piezoelectric element 15. Herein, the element electrode 15a was formed by chamfering upper edges of the sintered compact of the piezoceramic material, printing a silver paste to a top surface, other than the chamfered edge regions, of the sintered compact of the piezoceramic material and baking the silver paste. The resin molded part 11 was made of polyamide resin. The lead electrodes 14 and 16 were made of brass. The insulating plates 13p and 13t and the insulation sleeve 13s were made of PET (polyethylene terephthalate). The weighting member 17 was made of iron-based material for Sample No. 5 and made of brass for Sample Nos. 1 to 4 and 6 to 9. In each of Sample Nos. 1 to 9, the weight of the weighting member 17 was controlled to 10.0 g. Further, the whole of the top surface SB of the element electrode 15a faced the bottom surface SB of the weighting member 17 when the piezoelectric element 15 and the weighting member 17 were projected in a thickness direction of the piezoelectric element 15. The area S1 of the bottom surface SA of the weighting member 17 was controlled to 225.5 mm². On the other hand, the area S2 of the top surface SB of the element electrode 15a was varied to adjust the surface area ratio S2/S1 to different values. Each of the sample sensors were tested for capacitance Cp(20) at 20° C. in the same way as in Experiment 1. Further, the output of the sample sensor across the terminal portions 14a and 16a was measured through the application of a shock of 3G by a vibrator. The evaluation test results are indicated in TABLE 3 and FIG. 8.

TABLE 3

| No. | S1 (mm²) | S2 (mm²) | (S2/S1) × 100 (%) | Cp(20) (pF) | Output (mV) |
|---|---|---|---|---|---|
| 1 | 222.5 | 74.0 | 32.8 | 810 | 48.0 |
| 2 | 222.5 | 98.5 | 43.7 | 1030 | 71.0 |
| 3 | 222.5 | 101.5 | 45.0 | 1040 | 75.0 |
| 4 | 222.5 | 111.5 | 49.4 | 1040 | 88.0 |
| 5 | 222.5 | 130.0 | 57.6 | 1050 | 90.2 |
| 6 | 222.5 | 149.7 | 66.4 | 1050 | 96.5 |
| 7 | 222.5 | 190.0 | 84.3 | 1040 | 98.4 |
| 8 | 222.5 | 223.1 | 98.9 | 1020 | 108.6 |
| 9 | 222.5 | 240.0 | 106.4 | 1040 | 110.6 |

Figure 8:
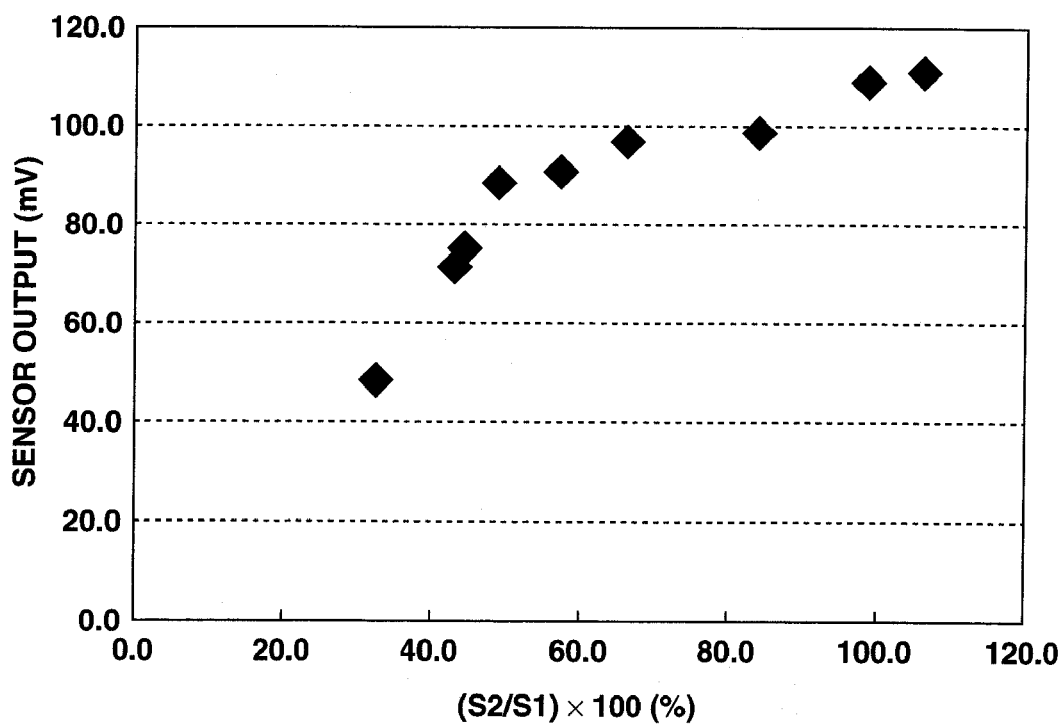
FIG. 8 is a diagram showing the output characteristics of a non-resonance knock sensor with respect to the ratio of the electrode surface area of the piezoelectric element to the bottom surface area of the weighting member according to one embodiment of the present invention.

As shown in TABLE 3 and FIG. 8, the sample sensor had an output of over 75 mV and showed practically favorable sensitivity when the surface area ratio S2/S1 was higher than or equal to 45%. It has been thus shown that it is desirable to control the surface area ratio S2/S1 to 45% or higher in order to secure high sensitivity in balance with cost performance.

The entire contents of Japanese Patent Application No. 2008-054433 (filed on Mar. 5, 2008), No. 2008-185029 (filed on Jul. 16, 2008) and No. 2008-317858 (filed on Dec. 15, 2008) are herein incorporated by reference.

Although the present invention has been described with reference to the above specific embodiments, the invention is not limited to these exemplary embodiments. Various modifications and variations of the embodiments described above will occur to those skilled in the art in light of the above teachings. The scope of the invention is defined with reference to the following claims.

What is claimed is:

1. A piezoceramic material having a composition represented by $Pb_m\{Zr_{1-x-y-z}Ti_xSn_y(Sb_{1-n}Nb_n)_z\}O_3$ where $1.000 \leq m \leq 1.075$, $0.470 \leq x < 0.490$, $0.020 \leq y \leq 0.040$, $0 < n < 1.000$ and $0 < z \leq 0.025$ and a crystallite size of 30 to 39 nm.

2. A piezoceramic material according to claim 1, wherein the piezoceramic material has a piezoelectric constant d33 of 340 pC/N or larger.

3. A piezoelectric element comprising an element body formed of a piezoceramic material according to claim 1.

4. A non-resonance knock sensor, comprising:
a piezoelectric element having an element body formed of a piezoceramic material according to claim 1 and at least one pair of electrodes arranged on the element body;
a support member having a support portion to support the piezoelectric element;
a weighting member disposed on the piezoelectric element to press the piezoelectric element against the support portion; and
a resin molded part covering the piezoelectric element and the weighting member from the outside of the support member.

5. A non-resonance knock sensor, comprising:
a piezoelectric element having an element body formed of a piezoceramic material according to claim 1 and a pair of first and second electrodes arranged on the element body;
a support member having a support portion to support the piezoelectric element; and
a weighting member disposed on the piezoelectric element to press the piezoelectric element against the support portion,
wherein at least part of a surface of the first electrode faces a bottom surface of the weighting member when the piezoelectric element and the weighting member are projected in a thickness direction of the piezoelectric element; and the ratio of an area of said at least part of the surface of the first electrode to an area of the bottom surface of the weighting member is 45% or higher.

6. A piezoceramic material having a composition represented by $Pb_m\{Zr_{1-x-y-z}Ti_xSn_y(Sb_{1-n}Nb_n)_z\}O_3$ where $1.000 \leq m \leq 1.075$, $0.470 \leq x < 0.490$, $0.020 \leq y \leq 0.040$, $0 < n < 1.000$ and $0 < z \leq 0.025$ and a piezoelectric constant d33 of 340 pC/N or larger.

7. A piezoelectric element comprising an element body formed of a piezoceramic material according to claim 6.

8. A piezoelectric sensor, comprising:
a piezoelectric element having an element body formed of a piezoceramic material according to claim 6 and at least one pair of electrodes arranged on the element body;
a support member having a support portion to support the piezoelectric element;
a weighting member disposed on the piezoelectric element to press the piezoelectric element against the support portion; and
a resin molded part covering the piezoelectric element and the weighting member from the outside of the support member.

9. A piezoelectric sensor comprising:
a piezoelectric element having an element body formed of a piezoceramic material according to claim 6 and a pair of first and second electrodes arranged on the element body;
a support member having a support portion to support the piezoelectric element; and
a weighting member disposed on the piezoelectric element to press the piezoelectric element against the support portion,
wherein at least part of a surface of the first electrode faces a bottom surface of the weighting member when the piezoelectric element and the weighting member are projected in a thickness direction of the piezoelectric element; and the ratio of an area of said at least part of the surface of the first electrode to an area of the bottom surface of the weighting member is 45% or higher.

* * * * *